(12) United States Patent
Nishimuda

(10) Patent No.: US 8,020,133 B2
(45) Date of Patent: Sep. 13, 2011

(54) SEMICONDUCTOR INTEGRATED CIRCUIT WITH MULTI-CUT VIA AND AUTOMATED LAYOUT METHOD FOR THE SAME

(75) Inventor: Keiichi Nishimuda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 489 days.

(21) Appl. No.: 12/076,637

(22) Filed: Mar. 20, 2008

(65) Prior Publication Data

US 2008/0235644 A1 Sep. 25, 2008

(51) Int. Cl.
G06F 17/50 (2006.01)
H01L 23/522 (2006.01)

(52) U.S. Cl. .................. 716/122; 716/119; 257/774

(58) Field of Classification Search .............. 716/10, 716/8, 119, 122; 257/774
See application file for complete search history.

(56) References Cited

U.S. PATENT DOCUMENTS

| | | | |
|---|---|---|---|
| 7,424,695 B2 | 9/2008 | Tamura et al. | |
| 2003/0079194 A1* | 4/2003 | Igarashi et al. | 716/8 |
| 2005/0141764 A1 | 6/2005 | Tohyama et al. | |
| 2005/0280159 A1 | 12/2005 | Okumura | |
| 2006/0036977 A1* | 2/2006 | Cohn et al. | 716/4 |
| 2006/0064653 A1* | 3/2006 | Zhang et al. | 716/2 |
| 2006/0101367 A1 | 5/2006 | Fujita et al. | |
| 2008/0141208 A1* | 6/2008 | Hirota | 716/14 |
| 2009/0217228 A1* | 8/2009 | Melzner | 716/10 |

FOREIGN PATENT DOCUMENTS

| | | |
|---|---|---|
| JP | 10-41393 | 2/1998 |
| JP | 2005-183907 | 7/2005 |
| JP | 2005-183907 A | 7/2005 |
| JP | 2006-228987 A | 8/2006 |

OTHER PUBLICATIONS

Japanese Office Action dated Feb. 12, 2009 with Partial English-Language Translation.
Japanese Office Action dated Oct. 10, 2008 with Partial English-Language Translation.

* cited by examiner

*Primary Examiner* — Jack Chiang
*Assistant Examiner* — Magid Y Dimyan
(74) *Attorney, Agent, or Firm* — McGinn Intellectual Property Law Group, PLLC

(57) ABSTRACT

A semiconductor integrated circuit according to an embodiment of the invention includes a single-cut via 60 and a multi-cut via 30 that includes a first via 30a and a second via 30b. An overhang (OHa or OHb) with respect to at least one of the first via 30a and the second via 30b is smaller than an overhang OH with respect to the single-cut via 60.

6 Claims, 10 Drawing Sheets

SEMICONDUCTOR INTEGRATED CIRCUIT WITH MULTI-CUT VIA AND AUTOMATED LAYOUT METHOD FOR THE SAME

FIELD OF THE INVENTION

The present invention relates to a semiconductor integrated circuit and a design technique for the same, and more particularly to a semiconductor integrated circuit with a multi-cut via and an automated layout design method for the same.

BACKGROUND OF THE INVENTION

In a semiconductor integrated circuit containing multiple wiring layers, a via is used to connect a wiring of one wiring layer with a wiring of another wiring layer. Generally, for signal lines other than the power lines, one via is provided for each connection point. Such via is called a "single-cut via".

With the increased miniaturization of a semiconductor integrated circuit, the wiring width has been reduced, and also the cross-sectional area of a via has decreased. Accordingly, in the manufacturing process, it has become difficult to form a via of a desired pattern. In a worst case scenario, an open failure occurs in the single-cut via formation part and thus the desired device operation cannot be implemented, resulting in a lower yield. Further, as the cross-sectional area of a via decreases, the delay time in signal lines increases, and disconnection rate also increases due to electronic migration. These cause lowering of device operation reliability.

In order to address these problems, multiple vias may be provided in parallel for each connection point. Such via is called a "multi-cut via". Particularly, when two vias are provided for each connection point, such via is called a "double-cut via". After the wiring layout, when as many single-cut vias as possible are replaced with multi-cut vias, the device operation reliability improves. This related art has been described in US Patent Application Publication Nos. US2005/0280159A1 and US2006/0101367A1.

FIG. 1A is a view illustrating an exemplary wiring layout using a conventional single-cut via. Wirings are laid out along wiring grids T1 to T5. For example, a first wiring W1 extending in a Y direction is laid out along the wiring grid T5; a second wiring W2 extending in an X direction is laid out along the wiring grid T2. The wirings W1 and W2 lie on different layers, and are connected to each other at an intersection IS of the wiring grids T2 and T5. Accordingly, a single-cut via pattern SV is arranged at the intersection IS.

FIG. 1B shows a layer structure of the single-cut via pattern SV. The single-cut via pattern SV is a combination of three figures A1 to A3. The figure A1 is a figure on the same wiring layer as the first wiring W1 and constitutes part of the first wiring W1. On the other hand, the second figure A2 is a figure on the same wiring layer as the second wiring W2 and constitutes part of the second wiring W2. The figure A3 represents a via. The single-cut via pattern SV is arranged so that the center of the figure A3 is located at the center of the intersection IS.

In view of "grid dislocation" occurring during manufacturing of the via, the both ends of the figure A1 are made to protrude by a width OH from the figure A3. Similarly, the both ends of the figure A2 are also made to protrude by a width OH from the figure A3. This width OH is called an "overhang" or "extension". That is, the overhang OH is provided as design constraint to ensure manufacturing reliability. According to our study, it is confirmed that overhang OH provided at least one of the first wiring W1 direction or the second wiring W2 direction is effective. Particularly, according to the technology where the gate length of a transistor is 90 nm or less, the overhang OH must be set.

FIG. 2A is a view illustrating an exemplary wiring layout using a conventional multi-cut via. Referring to FIG. 2A, instead of a single-cut via pattern SV, a multi-cut via pattern (double-cut via pattern) DV is provided at an intersection of the first wiring W1 and second wiring W2.

The multi-cut via pattern DV is a combination of four figures B1, B2, Ba and Bb. FIG. 2B shows a layer structure of the multi-cut via pattern DV. The figure B1 is a figure on the same layer as the first wiring W1 and constitutes part of the first wiring W1. On the other hand, the figure B2 is a figure on the same layer as the second wiring W2 and constitutes part of the second wiring W2. The figures Ba and Bb represent two vias constituting the multi-cut via. The center of the figure Ba agrees with the center of an intersection ISa of the wiring grids T3 and T5; and the center of the figure Bb agrees with the center of an intersection ISb of the wiring grids T2 and T5.

In the multi-cut via pattern DV, also, similarly to the single-cut via pattern SV, an overhang OH is provided as design constraint. More specifically, the both ends of the figure B1 protrude by the overhang OH from the figures Ba and Bb. Similarly, the both ends of the figure B2 also protrude by the overhang OH from the figures Ba and Bb.

The present inventor has noted the following point. That is, as described above, when a single-cut via is replaced with a multi-cut via, operation reliability improves. However, as the degree of semiconductor integrated circuit integration increases, the wiring becomes more complex. As a result, there is increased probability that the wirings are in close proximity to the vias. And while the overhang OH is set, the gap between wiring grids has become narrow. Thus, it is difficult to replace a single-cut via with a multi-cut via. For example, referring to FIG. 2A, after a wiring has been arranged along the wiring grid T4, a multi-cut via pattern DV cannot be arranged. In this state, if a multi-cut via pattern DV is arranged, there occurs a design violation between the wiring on the wiring grid T4 and the multi-cut via pattern DV. Consequently, not the multi-cut via pattern DV but the single-cut via pattern SV illustrated in FIG. 1A is arranged. Thus, the improvement in operation reliability cannot be expected so much.

SUMMARY

The present invention seeks to improve upon those problems at least in part.

An embodiment of the present invention discloses a semiconductor integrated circuit described below. The semiconductor integrated circuit includes: a first wiring formed on a first wiring layer; a second wiring formed on a second wiring layer different from the first wiring layer; and a multi-cut via formed in an overlap area in which the first wiring and the second wiring overlap. The multi-cut via includes a first via that connects the first wiring and the second wiring in the overlap area; and a second via that connects the first wiring and the second wiring in the overlap area. The overlap area contains a first end and a second end facing each other. The first end, first via, second via and second end are arranged along a predetermined direction in the described order. Further, the interval between the first end and first via is different from the interval between the second end and second via. According to the present embodiment, a multi-cut via can be used in an area in which no multi-cut via can be arranged according to related art, that is, only a single-cut via can be arranged. Thus, a semiconductor integrated circuit with higher reliability can be provided without increasing the chip area.

Further, the present embodiment discloses a semiconductor integrated circuit that includes: a single-cut via; and a multi-cut via including a first via and a second via. In the semiconductor integrated circuit, an overhang with respect to at least one of the first via and second via is smaller than an overhang with respect to the single-cut via. According to the present embodiment, a multi-cut via can be used in an area in which no multi-cut via can be arranged according to related art, that is, only a single-cut via can be arranged. Thus, a semiconductor integrated circuit with higher reliability can be provided without increasing the chip area.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

1. Multi-Cut Via Pattern

Figure 3A:
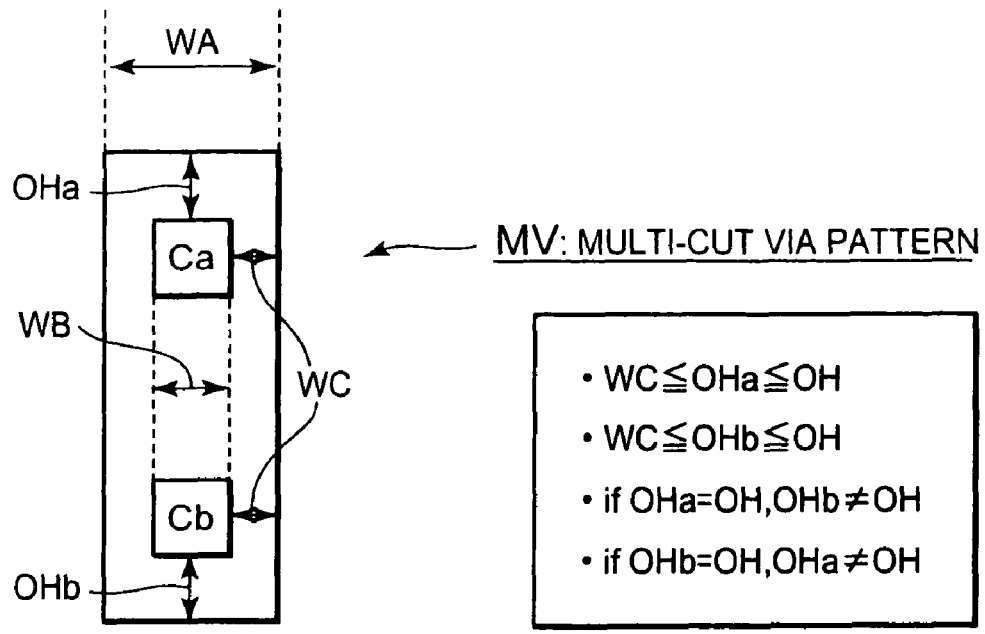
FIG. 3A is a conceptual view illustrating a multi-cut via pattern according to one embodiment of the present invention.
Figure 3B:
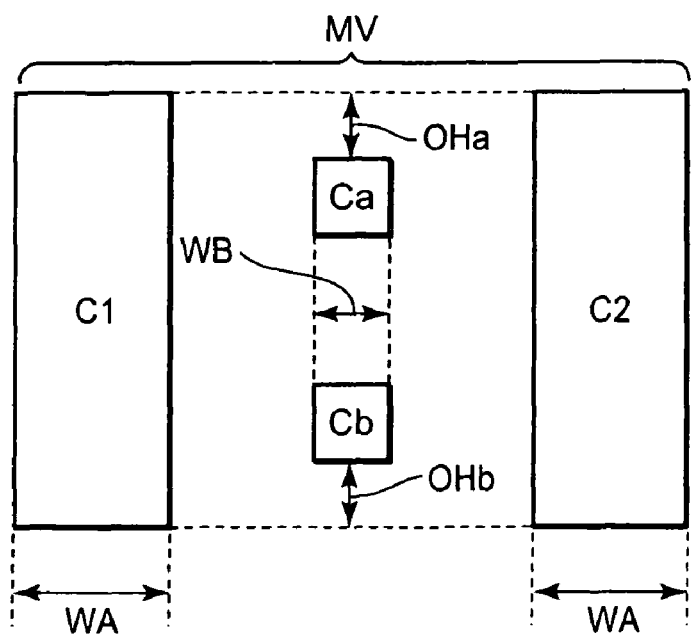
FIG. 3B illustrates each layer of FIG. 3A.

FIGS. 3A and 3B illustrate a multi-cut via pattern MV according to an embodiment of the present invention. FIG. 3A illustrates a plan view of the multi-cut via pattern MV, and FIG. 3B illustrates each layer thereof. The multi-cut via pattern MV according to the present embodiment is a combination of four figures C1, C2, Ca and Cb. The figure C1 is a figure on a first wiring layer and constitutes part of a first wiring formed on the first wiring layer. The figure C2 is a figure on a second wiring layer and constitutes part of a second wiring formed on the second wiring layer. The figures Ca and Cb represent two vias constituting the multi-cut via which connects the first wiring layer with the second wiring layer. Here, the multi-cut via may include three or more vias.

Referring to FIGS. 3A and 3B, WA denotes the wiring width; and WB denotes the via width. Typically, the wiring width WA is greater than the via width WB, and the difference between the wiring width WA and via width WB is expressed as 2×WC. Further, in view of "grid dislocation" occurring during manufacturing of the via, a margin is provided in a direction (wiring direction) orthogonal to the wiring width direction. More specifically, one end of the figures C1 and C2 representing the wiring protrude by a width OHa from the figure Ca, and the other end thereof protrude by a width OHb from the figure Cb. That is, the margins OHa and OHb are arranged between the end of the wiring and the via. The margins OHa and OHb provided along the wiring direction are "overhangs".

Figure 1A:
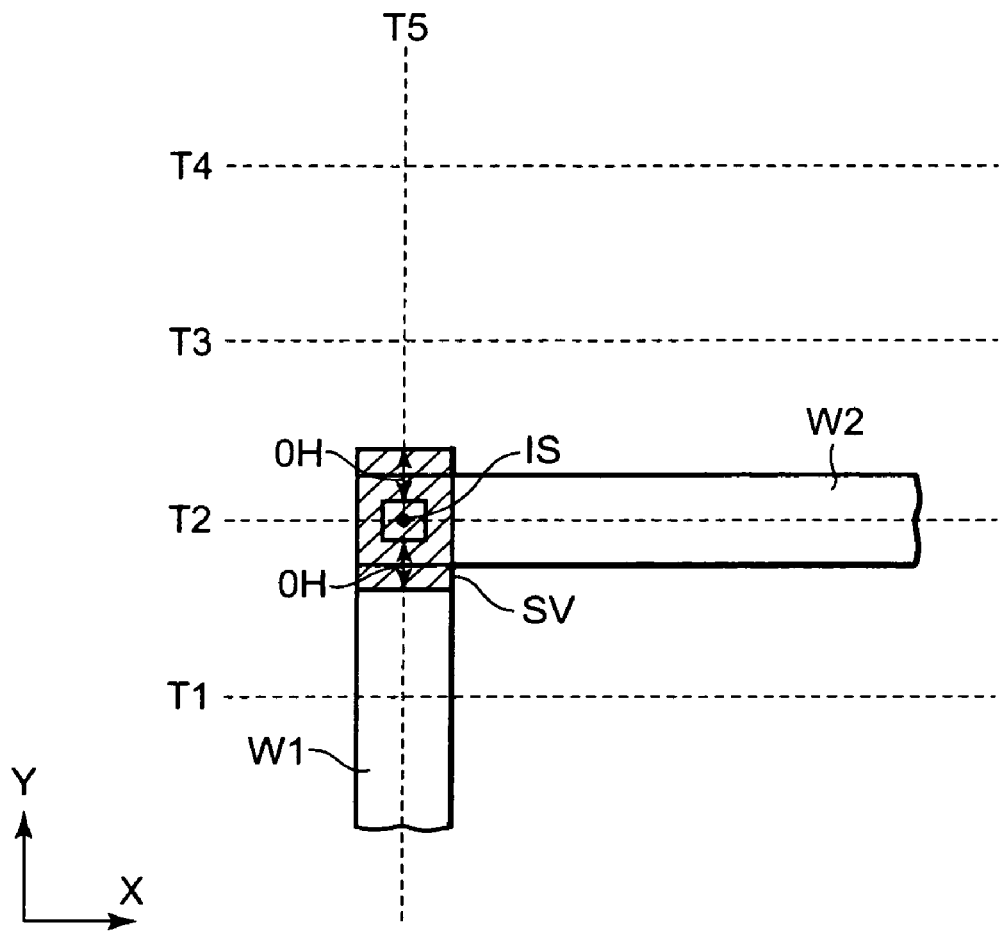
FIG. 1A is a plan view illustrating an exemplary wiring layout using a conventional single-cut via.
Figure 1B:
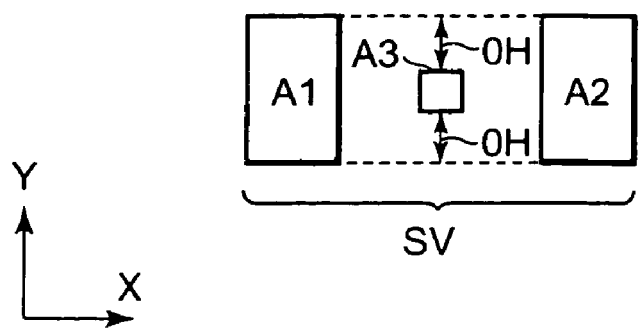
FIG. 1B illustrates each layer of the single-cut via portion of FIG. 1A.
Figure 2A:
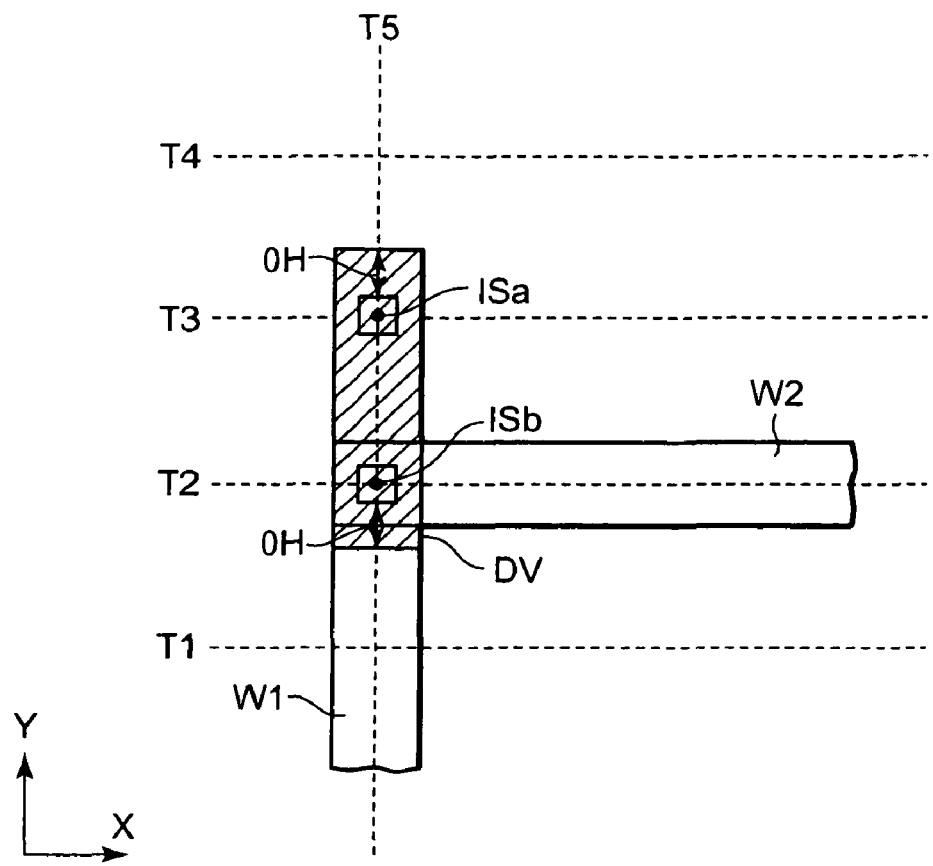
FIG. 2A is a plan view illustrating an exemplary wiring layout using a conventional multi-cut via.
Figure 2B:
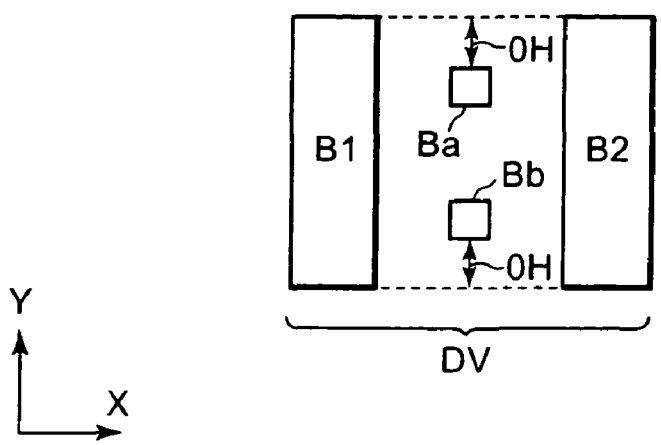
FIG. 2B illustrates each layer of the multi-cut via portion of FIG. 2A.

As illustrated in FIG. 3A, the "overhang OHa" is provided as design constraint with respect to the one via (Ca); and the "overhang OHb" is provided as design constraint with respect to the other via (Cb). According to the present embodiment, the overhang (OHa or OHb) with respect to at least one via is set smaller than the overhang OH (refer to FIGS. 1A and 2A) with respect to the conventional single-cut via SV or multi-cut via DV. More specifically, the overhangs OHa and OHb with respect to the multi-cut via MV according to the present embodiment satisfy the following relation.

$$WC \leq OHa \leq OH$$

$$WC \leq OHb \leq OH$$

The overhang OHa is set equal to or larger than the width WC and equal to or smaller than the conventional overhang OH. Similarly, the overhang OHb is set equal to or larger than the width WC and equal to or smaller than the conventional overhang OH. The overhangs OHa and OHb may be different from each other, or may be equal to each other. However, if one of the overhangs is equal to OH, the other overhang is not equal to OH. That is, at least one of the overhangs OHa and OHb is set smaller than the conventional overhang OH. In other words, design constraint is reduced with respect to at least one via of the multi-cut via pattern MV.

Consequently, the multi-cut via pattern MV can be arranged in an area in which no multi-cut via pattern cannot be arranged according to related art. Thus, the operation reliability of a manufactured semiconductor integrated circuit improves, compared to related art. Here, lowering of reliability caused by reduction of design constraint in the manufacturing process is small, compared to the improvement of operation reliability provided by using the multi-cut via.

2. Example of Application

Various examples of application of the multi-cut via pattern MV according to the present embodiment illustrated in FIGS. 3A and 3B will be described below.

2-1. First Example

Figure 4A:
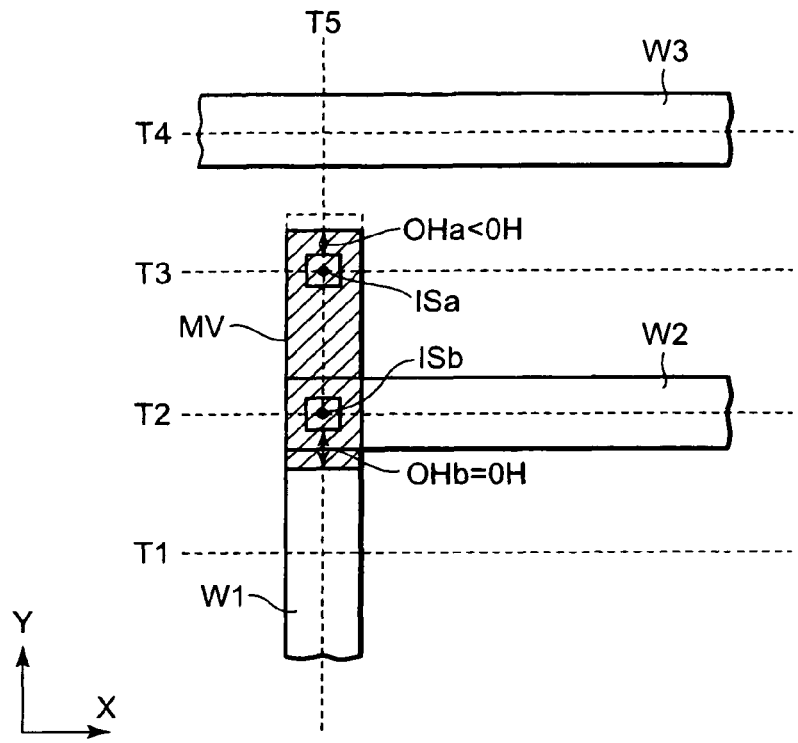
FIG. 4A is a plan view illustrating an exemplary wiring layout using the multi-cut via according to the one embodiment of the present invention.

FIG. 4A illustrates an exemplary wiring layout using the multi-cut via pattern MV. A first wiring W1 on a first wiring layer extending in a Y direction is laid out along a wiring grid T5. A second wiring W2 on a second wiring layer extending in an X direction is laid out along a wiring grid T2. The multi-cut via pattern MV is arranged at an intersection of the first wiring W1 and second wiring W2. The center of the figure Ca representing the one via lies on an intersection ISa of the wiring grids T3 and T5; and the center of the figure Cb representing the other via lies on an intersection ISb of the wiring grids T2 and T5.

According to the present example, one overhang OHa is set smaller than the conventional overhang OH (OHa<OH). The other overhang OHb is set equal to the conventional overhang OH (OHb=OH). Therefore, the overhangs OHa is smaller than the overhang OHb (OHa<OHb). In this case, referring to FIG. 4A, no design violation occurs between a third wiring W3 laid out along a wiring grid T4 and the multi-cut via pattern MV.

For example, consider a case where, after all wirings have been laid out using a single-cut via pattern SV, the single-cut via pattern SV is replaced with a multi-cut via pattern MV. Referring to FIG. 4A, after a third wiring W3 has been laid out along the wiring grid T4, the multi-cut via pattern DV according to related art cannot be used. In contrast, according to the present embodiment, the single-cut via pattern SV can be replaced with the multi-cut via pattern MV. That is, the probability of replacement with the multi-cut via increases. Consequently, the operation reliability of a manufactured semiconductor integrated circuit improves.

Wirings may be laid out using the multi-cut via pattern MV in the first place. In this case, also, the probability of placement of the multi-cut via increases. Consequently, the operation reliability of a manufactured semiconductor integrated circuit improves. Also, consider a case where, when the wirings W1 and W2 are laid out, the third wiring W3 has not been laid out yet. In this case, according to related art, after the multi-cut via pattern DV has been arranged, the third wiring W3 cannot be additionally arranged. That is, when the operation reliability is raised, the easiness in wiring arrangement lessens. However, according to the present embodiment, as illustrated in FIG. 4A, even after the multi-cut via pattern MV has been arranged, the third wiring W3 can be additionally arranged. That is, the easiness in wiring arrangement improves, compared to related art. In other words, lessening of the easiness in wiring arrangement can be suppressed while maintaining operation reliability.

Figure 4B:
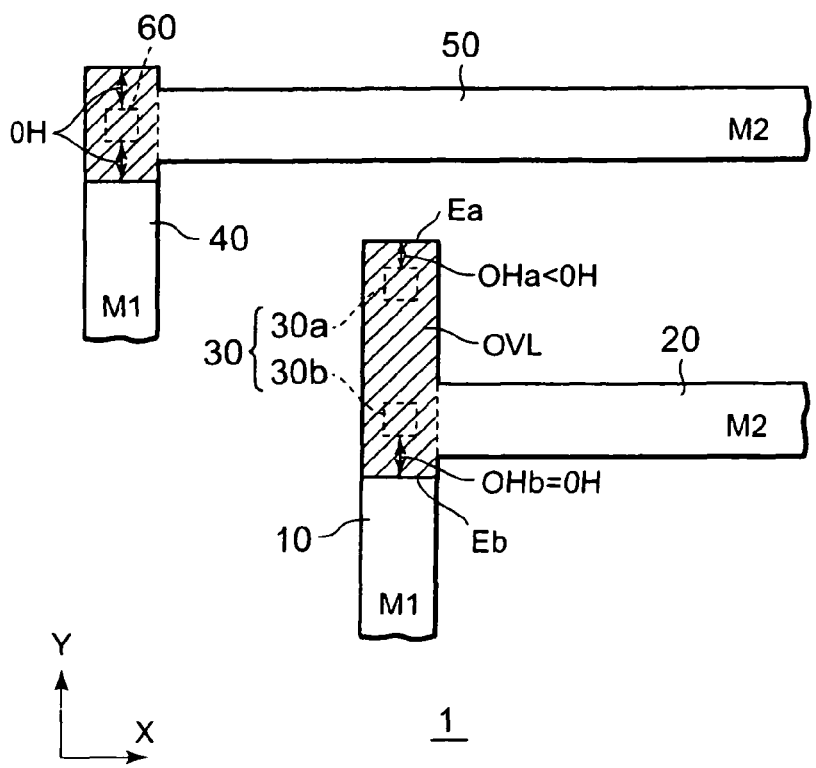
FIG. 4B is a plan view illustrating a configuration of a semiconductor integrated circuit manufactured based on the wiring layout illustrated in FIG. 4A.

FIG. 4B is a plan view illustrating a configuration of a semiconductor integrated circuit 1 manufactured based on the wiring layout illustrated in FIG. 4A. Referring to FIG. 4B, a first wiring 10 is formed on a first wiring layer M1; and a second wiring 20 is formed on a second wiring layer M2. The first wiring 10 and second wiring 20 are connected via a multi-cut via 30. To be more in detail, the first wiring 10 and second wiring 20 overlaps with each other in a "overlap area OVL", and the multi-cut via 30 is formed in the overlap area OVL. The multi-cut via 30 includes a first via 30a and a second via 30b connecting the first wiring 10 and second wiring 20.

The shape of the first wiring 10 is a combination of the pattern of the first wiring W1 of FIG. 4A and the figure C1 contained in the multi-cut via pattern MV. The shape of the second wiring 20 is a combination of the pattern of the second wiring W2 of FIG. 4A and the figure C2 contained in the multi-cut via pattern MV. Thus, the overlap area OVL of FIG. 4B reflects the entire shape of the multi-cut via pattern MV of FIG. 4A. A first via 30a and second via 30b of FIG. 4B correspond to the figures Ca and Cb of the multi-cut via pattern MV, respectively. Accordingly, after manufacturing of the semiconductor integrated circuit 1, overhangs OHa and OHb can be measured and compared. In this example, the overhang OHa with respect to the first via 30a is smaller than the overhang OHb with respect to the second via 30b (OHa<OHb).

The overhangs OHa and OHb can also be defined as follows. As illustrated in FIG. 4B, Ea and Eb denote facing ends of the overlap area OVL. The facing ends Ea and Eb of the overlap area OVL are ends arranged in a direction (Y direction) orthogonal to the wiring width direction (X direction) in the overlap area OVL. The end Ea, first via 30a, second via 30b and end Eb are arranged in the Y direction in the described order. The gap between the end Ea and first via 30a is the overhang OHa; the gap between the end Eb and second via 30b is the overhang OHb.

When the semiconductor integrated circuit 1 includes a single-cut via, an overhang OH with respect to the single-cut via can also be measured. For example, referring to FIG. 4B, a wiring 40 is formed on a first wiring layer M1; and a wiring 50 is formed on a second wiring layer M2. The wiring 50 corresponds to the third wiring W3 of FIG. 4A. The wirings 40 and 50 are connected to each other via a single-cut via 60. OH denotes an overhang with respect to the single-cut via 60. In this example, the overhang OHa with respect to the first via 30a is smaller than the overhang OH with respect to the single-cut via 60 (OHa<OH). The overhang OHb with respect to the second via 30b is substantially equal to the overhang OH with respect to the single-cut via 60 (OHb=OH).

2-2. Second Example

Figure 5A:
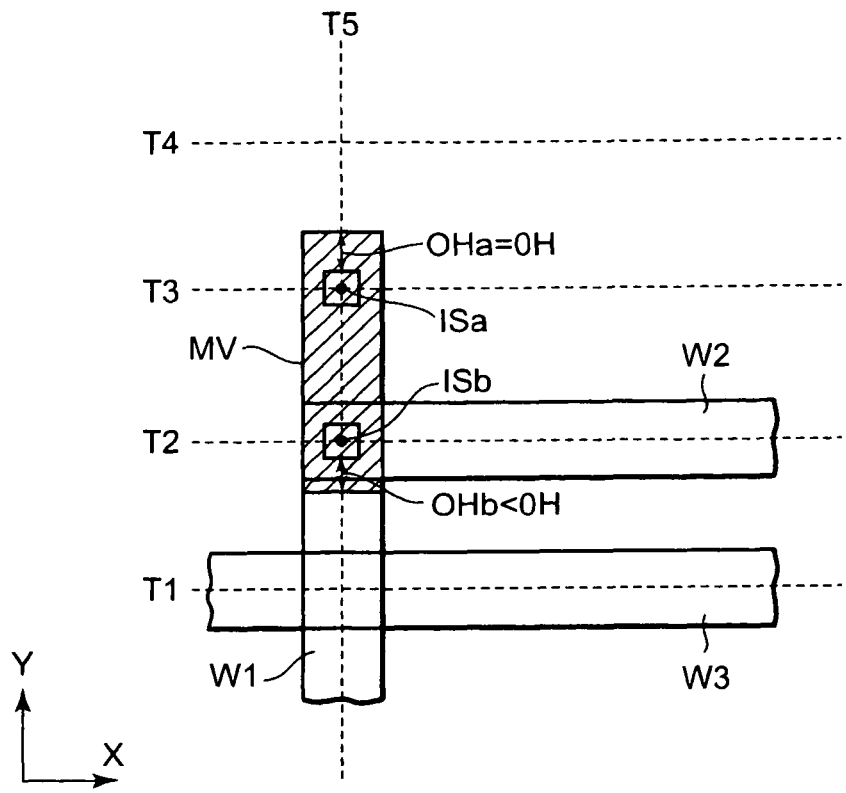
FIG. 5A is a plan view illustrating another exemplary wiring layout using the multi-cut via according to the one embodiment of the present invention.
Figure 5B:
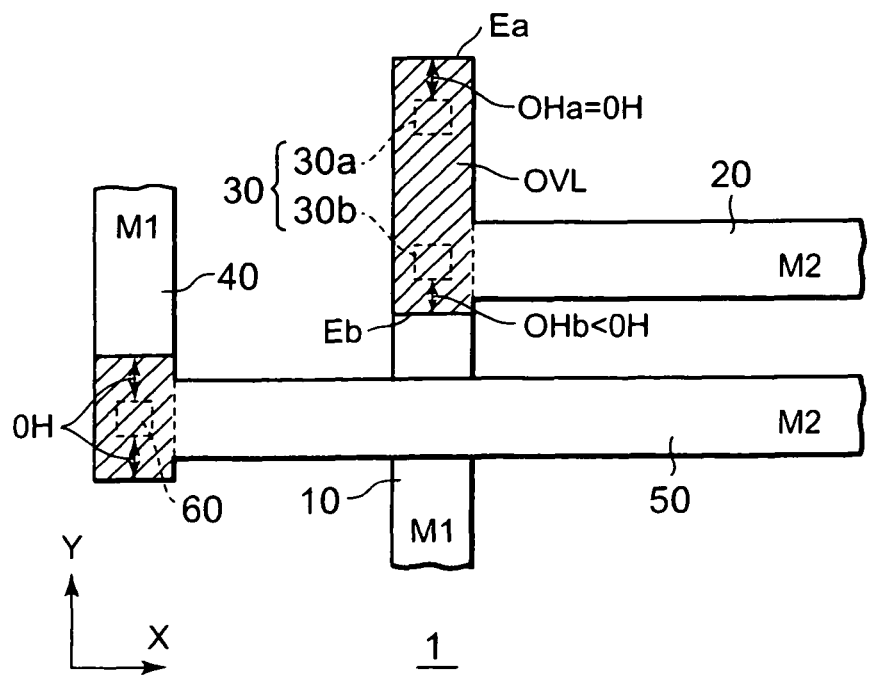
FIG. 5B is a plan view illustrating a configuration of a semiconductor integrated circuit manufactured based on the wiring layout illustrated in FIG. 5A.

FIG. 5A illustrates another exemplary wiring layout using a multi-cut via pattern MV; FIG. 5B is a plan view illustrating a configuration of a semiconductor integrated circuit 1 manufactured based on the wiring layout illustrated in FIG. 5A. The same reference characters are applied to constituent elements corresponding to the first example, and hence an explanation thereof is omitted.

As illustrated in FIG. 5A, in this example, one overhang OHa is set equal to the conventional overhang OH (OHa=OH). The other overhang OHb is set smaller than the conventional overhang OH (OHa<OH). Therefore, the overhang OHb is smaller than the overhang OHa (OHb<OHa). In this case, even after a third wiring W3 has been laid out along a wiring grid T1, a multi-cut via pattern MV can be arranged. Alternatively, after the multi-cut via pattern MV has been arranged, the third wiring W3 can be laid out along the wiring grid T1. Accordingly, operation reliability and the easiness in wiring arrangement improve, compared to related art.

As illustrated in FIG. 5B, in this example, the overhang OHa with respect to the first via 30a is substantially equal to the overhang OH with respect to the single-cut via 60 (OHa=OH); and the overhang OHb with respect to the second via 30b is smaller than the overhang OH with respect to the single-cut via 60 (OHb<OH). Therefore, the overhang OHb with respect to the second via 30b is smaller than the overhang OHa with respect to the first via 30a (OHb<OHa).

2-3. Third Example

Figure 6A:
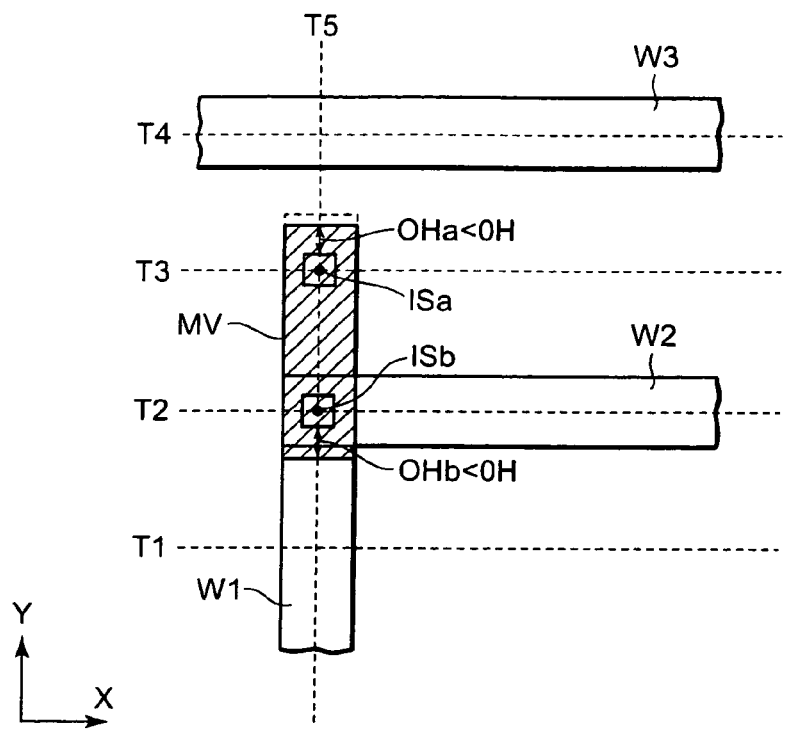
FIG. 6A is a plan view illustrating another exemplary wiring layout using the multi-cut via according to the one embodiment of the present invention.
Figure 6B:
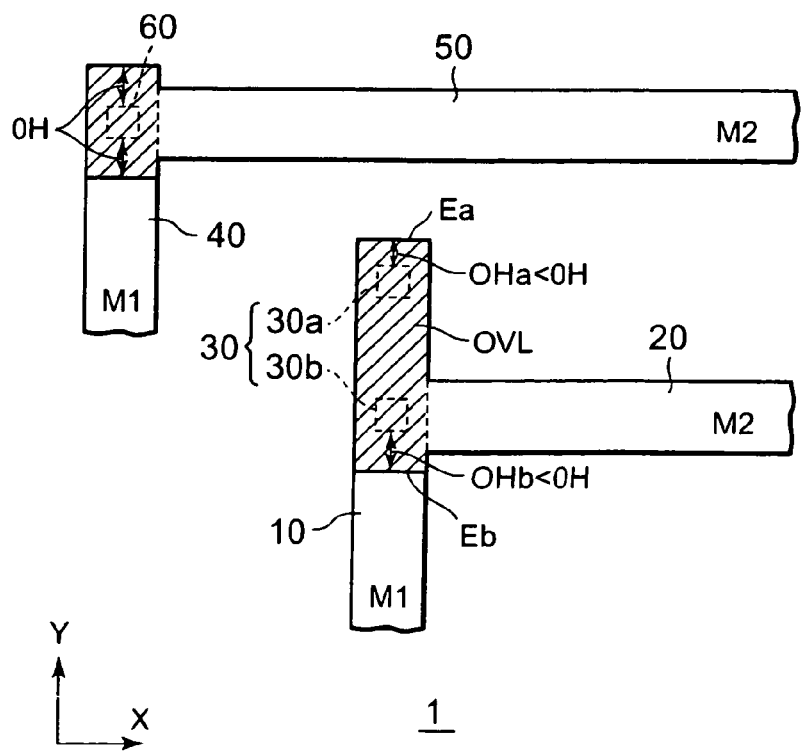
FIG. 6B is a plan view illustrating a configuration of a semiconductor integrated circuit manufactured based on the wiring layout illustrated in FIG. 6A.

FIG. 6A illustrates another exemplary wiring layout using a multi-cut via pattern MV; FIG. 6B is a plan view illustrating a configuration of a semiconductor integrated circuit 1 manufactured based on the wiring layout illustrated in FIG. 6A. The same reference characters are applied to constituent elements corresponding to the above examples, and hence an explanation thereof is omitted.

This example is a combination of the first and second examples. That is, the overhangs OHa and OHb are both set smaller than the conventional overhang OH (OHa<OH, OHb<OH). As a result, the highest probability of placement of the multi-cut via pattern MV is provided. Accordingly, when the multi-cut via pattern MV according to this example is used, operation reliability and the easiness in wiring arrangement significantly improve. On the other hand, when a certain degree of manufacturing reliability must be ensured, the multi-cut via pattern MV illustrated in the first example or second example is preferably used.

2-4. Fourth Example

Figure 7A:
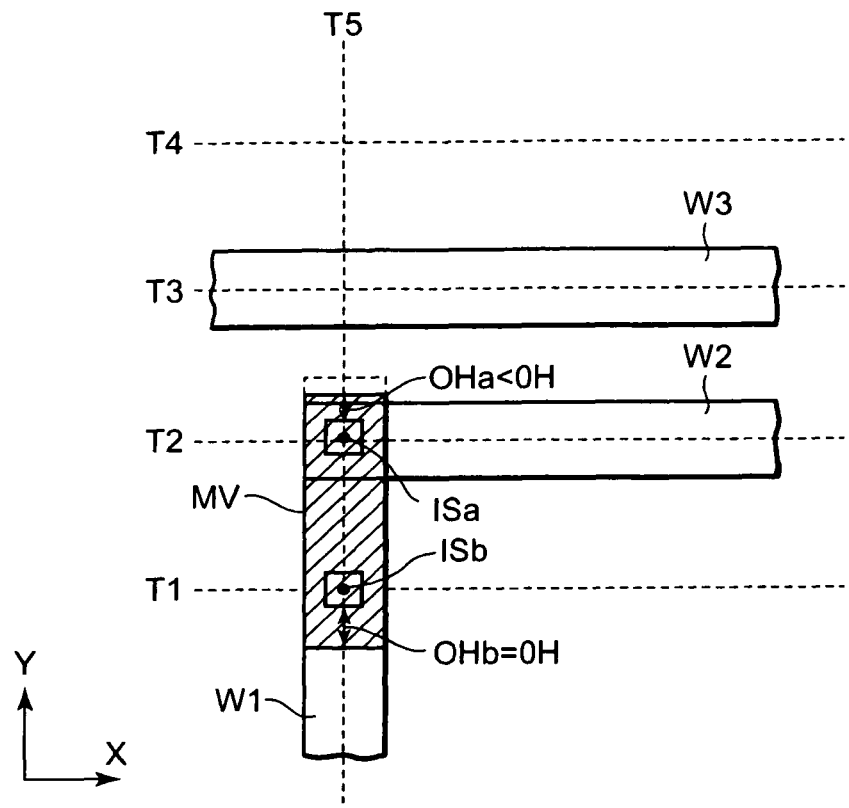
FIG. 7A is a plan view illustrating another exemplary wiring layout using the multi-cut via according to the one embodiment of the present invention.
Figure 7B:
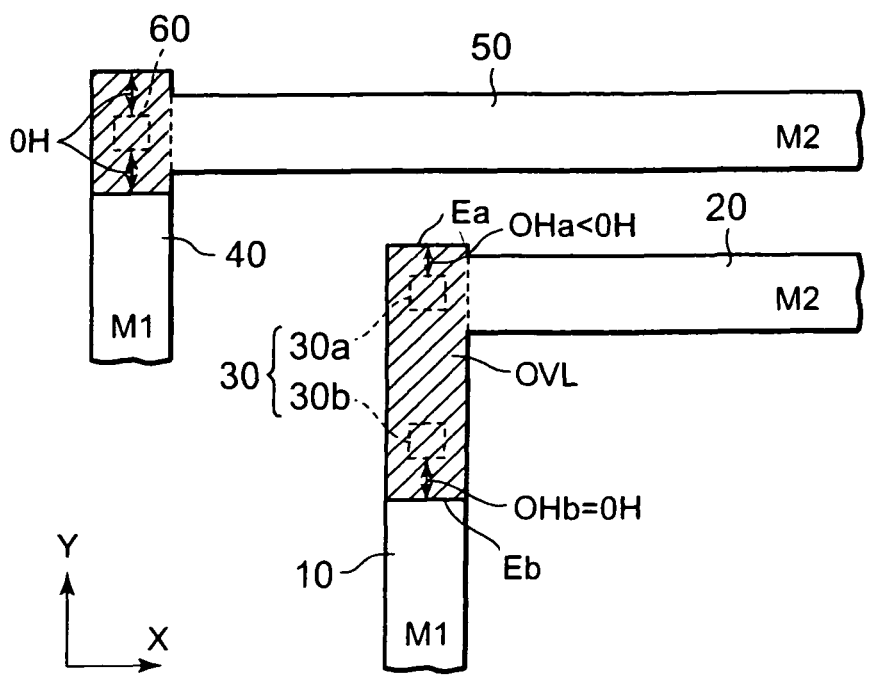
FIG. 7B is a plan view illustrating a configuration of a semiconductor integrated circuit manufactured based on the wiring layout illustrated in FIG. 7A.

FIG. 7A illustrates another exemplary wiring layout using a multi-cut via pattern MV; FIG. 7B is a plan view illustrating a configuration of a semiconductor integrated circuit 1 manufactured based on the wiring layout illustrated in FIG. 7A. The same reference characters are applied to constituent elements corresponding to the above examples, and hence an explanation thereof is omitted.

In this example, the via position is different from that of the first example. More specifically, the center of a figure Ca representing one via is located at an intersection ISa of wiring grids T2 and T5; and the center of a figure Cb representing the other via is located at an intersection ISb of wiring grids T1 and T5. In this case, no design violation occurs between a third wiring W3 laid out along a wiring grid T3 and the multi-cut via pattern MV. In other aspects, this example is similar to the first example. With regard to the second example and third example, also, a similar layout is possible.

3. Design System

Figure 8:
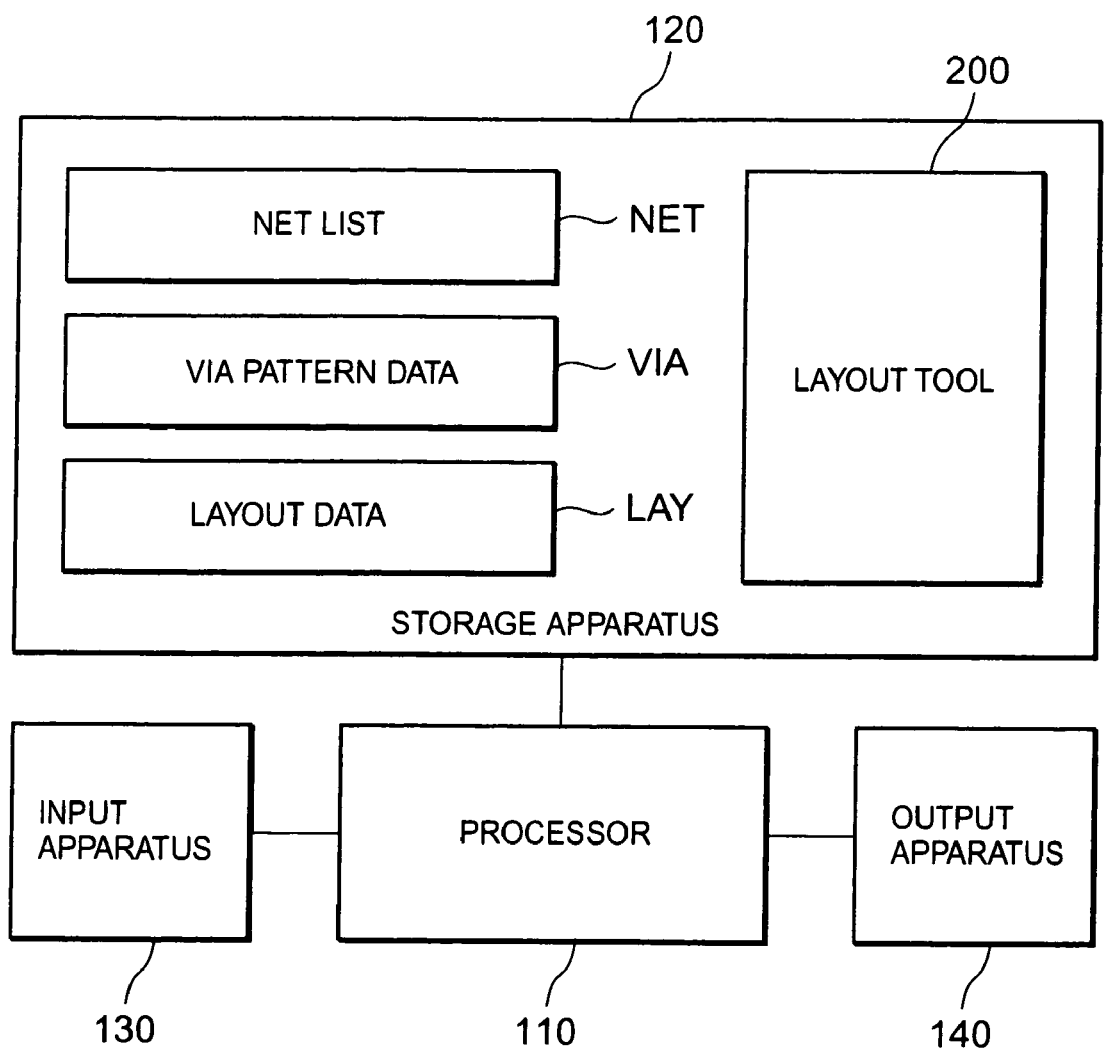
FIG. 8 is a block diagram illustrating an LSI design system according to the one embodiment of the present invention.

Layout design according to the present embodiment is performed using a computer. FIG. 8 is a block diagram illustrating an exemplary LSI design system 100 according to the present embodiment. The LSI design system 100 includes a processor 110, storage apparatus 120, input apparatus 130 and output apparatus 140. The processor 110 processes data. Examples of the storage apparatus 120 include HDD and RAM. Examples of the input apparatus 130 include a keyboard and mouse. Examples of the output apparatus 140 include a display and printer.

In the storage apparatus 120, there are stored net list NET, layout data LAY and via pattern data VIA. The net list NET is data indicating a connection relation between elements in an LSI for which a layout is to be designed. The layout data LAY is data indicating an LSI layout obtained by carrying out a layout design processing. The via pattern data VIA is data used during layout design processing.

Figure 9:
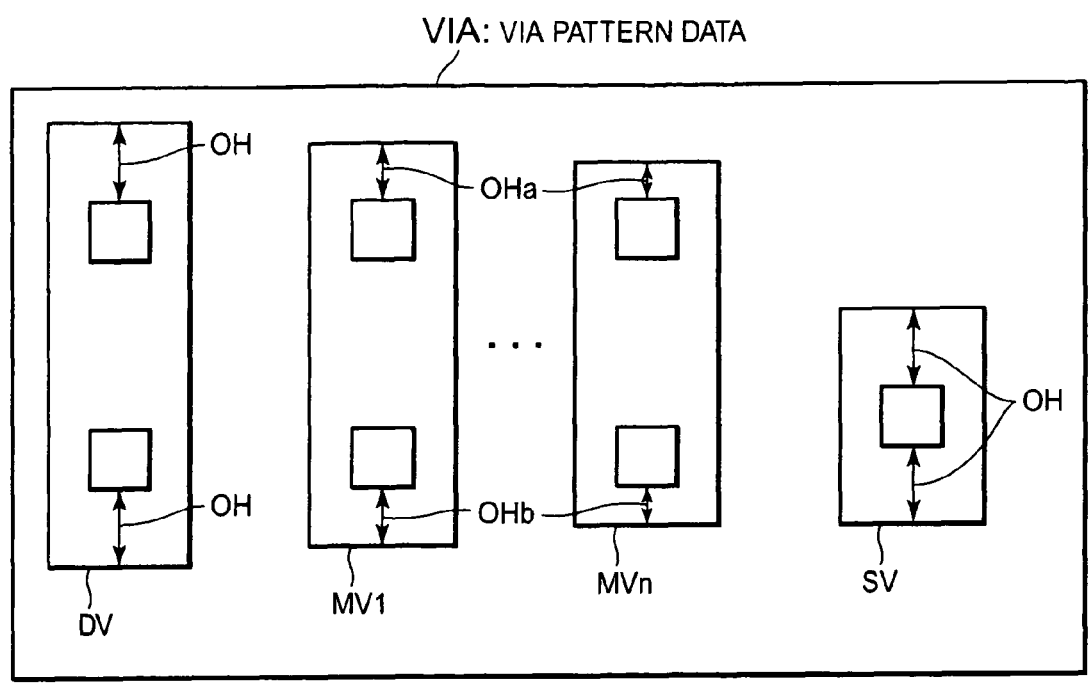
FIG. 9 is a conceptual view illustrating exemplary via pattern data used in the embodiment of the present invention.

FIG. 9 illustrates an exemplary via pattern data VIA. The via pattern data VIA indicates multiple via patterns. For example, as the multiple via patterns, there are included the single-cut via pattern SV (refer to FIG. 1A), the conventional multi-cut via pattern DV (refer to FIG. 2A) and the multi-cut via patterns MV1 to MVn (refer to FIG. 3A) according to the present embodiment. Of the multi-cut via patterns MV1 to MVn according to the present embodiment, at least one of them is prepared (n being one or more). When the multi-cut via patterns MV1 to MVn are prepared, the overhangs OHa and OHb with respect to each pattern are set to various values.

Referring to FIG. 8 again, in the storage apparatus 120, there is also stored a layout tool 200. The layout tool 200 is a computer program executed by the processor 110. Using the command of the layout tool 200, the processor 110 carries out a layout design processing according to the present embodiment. More specifically, the processor 110 reads the net list NET and via pattern data VIA from the storage apparatus 120 and carries out a wiring processing and via arrangement processing by using the data. As a result, the layout data LAY is produced.

The computer program code and data structures described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile disk), and semiconductor memory devices.

Figure 10:
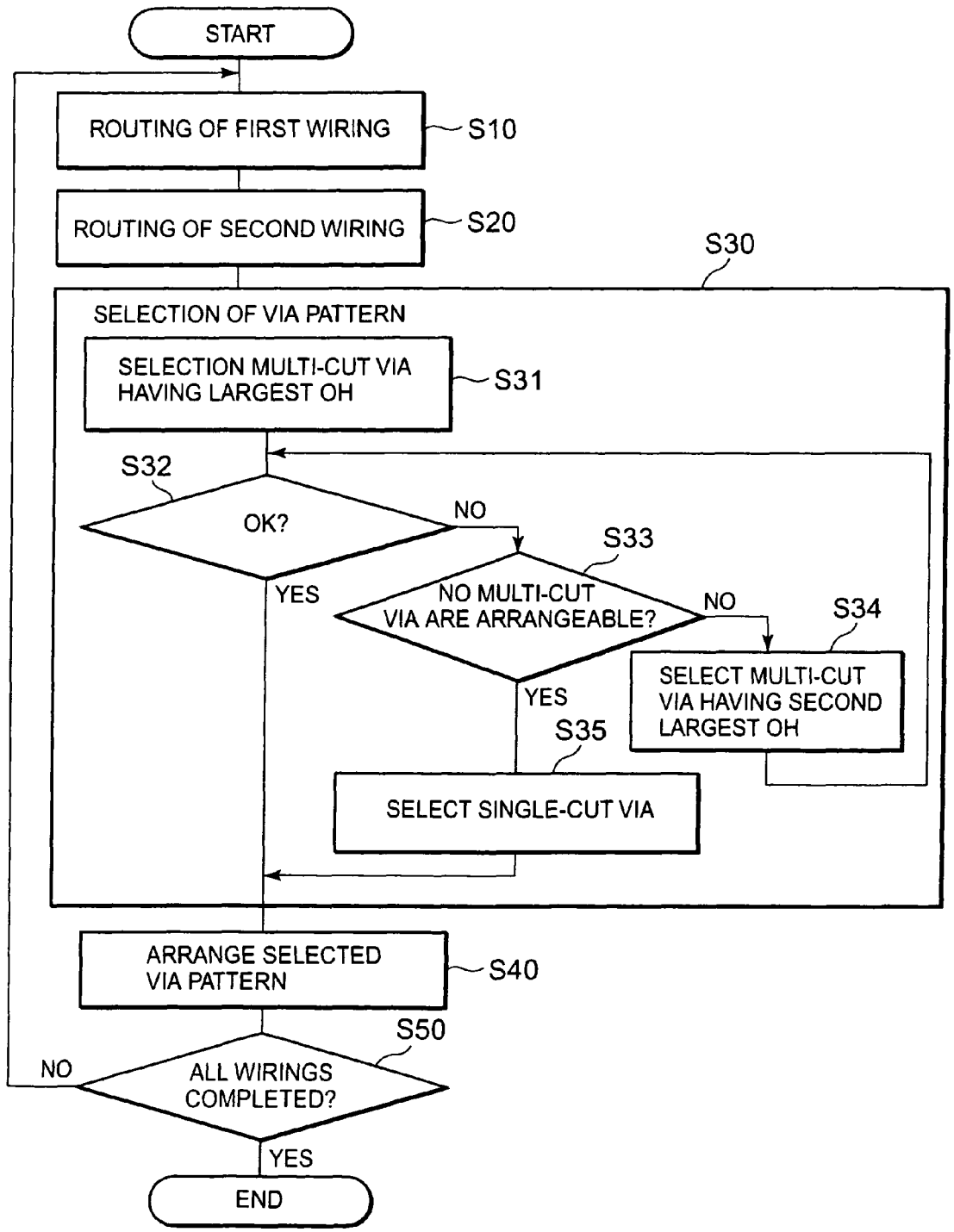
FIG. 10 is a flowchart illustrating a layout design process according to the one embodiment of the present invention.

FIG. 10 is a flowchart illustrating an exemplary wiring processing and via arrangement processing according to the present embodiment of the present invention. Firstly a routing (layout) of the first wiring W1 on the first wiring layer is carried out (step S10). Subsequently, a routing of the second wiring W2 on the second wiring layer is carried out (step S20). Subsequently, a via pattern to be arranged at an intersection of the first wiring W1 and second wiring W2 is selected (step S30). In this case, that via pattern is selected from among multiple via patterns indicated by the via pattern data VIA according to the surrounding wiring state.

Firstly a multi-cut via pattern having a largest overhang is selected from the via pattern data VIA (step S31). In the example of FIG. 9, the conventional multi-cut via pattern DV is selected. Subsequently, it is verified whether the selected multi-cut via pattern satisfies the design rule. That is, in view of the surrounding wiring state, it is verified whether the selected multi-cut via pattern can be arranged (step S32). If so (step S32; Yes), the selected multi-cut via pattern is used.

If not so (step S32; No), another multi-cut via pattern is selected (step S33; No). In this case, a multi-cut via pattern MV having a second largest overhang is selected (step S34). Thereafter, step S32 is executed again. If no multi-cut via patterns are arrangeable (step S33; Yes), a single-cut via pattern SV is selected (step S35).

Thereafter, the one via pattern selected in step S30 is arranged (step S40). When such processing is repeated, the layout design according to the present embodiment is implemented.

It is apparent that the present invention is not limited to the above embodiments, but may be modified and changed without departing from the scope and spirit of the invention.

What is claimed is:
1. A semiconductor integrated circuit comprising:
a first wiring formed on a first wiring layer and prolonged in a first direction;
a second wiring formed on a second wiring layer and prolonged in a second direction; and
a multi-cut via formed to connect the first wiring to the second wiring, the multi-cut via including a first via and a second via formed in the first direction, a distance between the first via and the second via being longer than a width of the second wiring, wherein an overhang with respect to the first via is different from an overhang with respect to the second via.

2. The semiconductor integrated circuit according to claim 1, wherein the overhang with respect to any of the first via and the second via is smaller than an overhang with respect to a single-cut via.

3. The semiconductor integrated circuit according to claim 1, further comprising:

a third wiring adjacent to the second wiring formed on the second wiring layer, wherein the first via is formed at a point closer to the third wiring than the second via and an overhang with respect to the first via is smaller than the overhang with respect to the second via.

4. A layout method of a semiconductor integrated circuit comprising:

forming, using a layout tool executed by a processor on a computer, a first wiring on a first wiring layer, the first wiring being prolonged in a first direction;

forming, using the layout tool, a second wiring on a second wiring layer, the second wiring layer being prolonged in a second direction; and forming, using the layout tool, a multi-out via to connect the first wiring to the second wiring, the multi-cut via including a first via and a second via formed in the first direction, a distance between the first via and the second via being longer than a width of the second wiring, wherein an overhang with respect to the first via is different from an overhang with respect to the second via.

5. The layout method according to claim 4, wherein an overhang with respect to any of the first via and the second via is smaller than the overhang with respect to a single-cut via.

6. The layout method according to claim 4, further comprising forming a third wiring adjacent to the second wiring on the second wiring layer, wherein the first via is formed at a point closer to the third wiring than the second via and the overhang with respect to the first via is smaller than the overhang with respect to the second via.

* * * * *